United States Patent
Venugopal et al.

(10) Patent No.: US 10,187,061 B1
(45) Date of Patent: Jan. 22, 2019

(54) LEVEL SHIFTING CIRCUIT WITH DATA RESOLUTION AND GROUNDED INPUT NODES

(71) Applicant: Apple Inc., Cupertino, CA (US)

(72) Inventors: Vivekanandan Venugopal, San Jose, CA (US); Ajay Kumar Bhatia, Saratoga, CA (US); Michael R. Seningen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/625,642

(22) Filed: Jun. 16, 2017

(51) Int. Cl.
  *H03K 19/0185* (2006.01)
  *H03K 19/00* (2006.01)
  *H03K 5/08* (2006.01)
  *H03K 3/037* (2006.01)

(52) U.S. Cl.
  CPC ......... *H03K 19/0013* (2013.01); *H03K 3/037* (2013.01); *H03K 5/08* (2013.01); *H03K 19/018521* (2013.01)

(58) Field of Classification Search
  CPC ...... H03K 3/037; H03K 5/08; H03K 19/0013; H03K 19/018521
  See application file for complete search history.

(56) References Cited

U.S. PATENT DOCUMENTS

| | | | | |
|---|---|---|---|---|
| 6,545,521 | B2 * | 4/2003 | Dale | H03K 19/00315 327/333 |
| 6,667,648 | B2 * | 12/2003 | Stout | H03K 19/018521 327/333 |
| 7,005,908 | B2 * | 2/2006 | Lee | H03K 3/356113 326/68 |
| 7,417,481 | B2 | 8/2008 | Ahsanullah | |
| 7,528,628 | B2 | 5/2009 | Huang | |
| 8,723,551 | B2 * | 5/2014 | Cho | H03K 3/356113 326/63 |
| 8,816,749 | B2 | 8/2014 | Alessandro | |
| 2012/0187998 | A1 * | 7/2012 | Jarrar | H03K 3/356182 327/333 |

FOREIGN PATENT DOCUMENTS

KR   100528546   3/2005

* cited by examiner

*Primary Examiner* — Alexander H Taningco
*Assistant Examiner* — Kurtis R Bahr
(74) *Attorney, Agent, or Firm* — Meyertons, Hood, Kivlin, Kowert & Goetzel, P.C.

(57) ABSTRACT

An apparatus and method for operating a level shifter circuit that receives an input signal of interderminate voltage level is disclosed. The level shifter circuit may receive the input signal from a circuit block coupled to a first power supply signal, and generate an output signal using a second power supply signal, different than the first power supply signal. The level shifter circuit may clamp a storage node included in the level shifter circuit, and isolated at least one circuit path included in the level shifter circuit in response to a determination that an isolation signal has been enabled.

20 Claims, 9 Drawing Sheets

LEVEL SHIFTING CIRCUIT WITH DATA RESOLUTION AND GROUNDED INPUT NODES

BACKGROUND

Technical Field

Embodiments described herein are related to the field of integrated circuit implementation, and more particularly to level shifting circuits.

Description of the Related Art

Some integrated circuits (ICs) may include more than one power supply. Each power supply may output a power signal at a different voltage from the other power supplies. In some ICs, one or more voltage regulators may be used to generate power signals of varying voltage levels from a single power supply. The various power signals may be used by different circuits in an IC, each power signal supplying power in a respective power domain. In an IC, a processing core may be in a first power domain and another circuit, such as, for example, a memory array, may be in a second power domain. Voltage levels associated with the high logic values of data and control signals used between the processing core and the memory array need to be shifted from the voltage level of the first power domain to the voltage level of the second power domain, and vice versa.

A level shifting circuit may be used to shift a logic signal between power domains. A level shifting circuit, also referred to as a level shifter, receives a logic signal generated in the first power domain, and generates an output signal, with a same logic value, in the second power domain.

SUMMARY OF THE EMBODIMENTS

Various embodiments of a system-on-a-chip (SoC), including level shifting circuit, are disclosed. Broadly speaking, a system, an apparatus, and a method are contemplated in which the system includes a first circuit block coupled to a first power supply signal and may be configured to generate a first signal using the first power supply signal. The system may also include a level shifter circuit coupled to the first power supply signal, and a second power supply signal, and may be configured generate a second signal using the first signal and the second power supply signal and, in response to a determination that an isolation signal is enabled, set a voltage level of a storage node included in the level shifter circuit to a particular voltage level, and isolate at least one circuit path included in the level shifter circuit from a power supply node.

In a further embodiment, to isolate the at least one circuit path, the level shifter circuit is may be further configured to deactivate at least one device coupled to the power supply node.

In another embodiment, the power supply node may include a ground node.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Systems-on-chip (SoCs) may include multiple circuits operating at different power supply voltage levels. Circuits coupled to a common power supply signal at a particular voltage level are referred to as belonging to the same "power domain" (also referred to herein as a "voltage domain"). During operation of an SoC, logic signals may be transmitted from a circuit in one power domain to a circuit in another power domain. In cases where the two power domains employ different power supply voltage levels, voltage levels of the transmitted logic signals may need to be adjusted (in a process commonly referred to as "level shifting") so the logic signals are compatible with the receiving circuit. Level shift circuits may be used transmit logic signals between power domains and mitigate these types of issues.

To manage power consumption in an SoC, the SoC may identify circuits that are not being used. To reduce power consumption, power signals of power domains that include such unused circuits may be decoupled from power supply circuits in a process referred to as "power gating." When the power supply signal of a particular power domain is decoupled from the power supply circuits, the voltage level of the power supply signal may be indeterminate. Such indeterminate voltage levels on power supply signals may be problematic for any level shifter circuits receiving logic signals from a power gated power domain.

When a level shifter circuit receives signals from a power gated power domain, the level shifter circuit may experience "crowbar" or "shoot-through" current created when a low impedance circuit path is enabled between a power supply node and a ground node. As used and described herein, a circuit path refers to a collection of circuit elements coupled together between two circuit nodes, such as, between a power supply node and a ground node, for example.

In addition to crowbar current resulting from receiving signals from a power gated power domain, storage nodes included in level shifter circuits may transition to undesirable voltage levels due to the indeterminate voltage levels on the power supply signals, which may result in unwanted signal transitions when the power supply voltage levels return to specified operating levels. The embodiments illustrated in the drawings and described below may provide techniques for operating a level shifter circuit that may reduce crowbar current in the latch, and maintain a stable output state during power gating or other events that result in indeterminate voltage levels on the input circuits.

Figure 1:
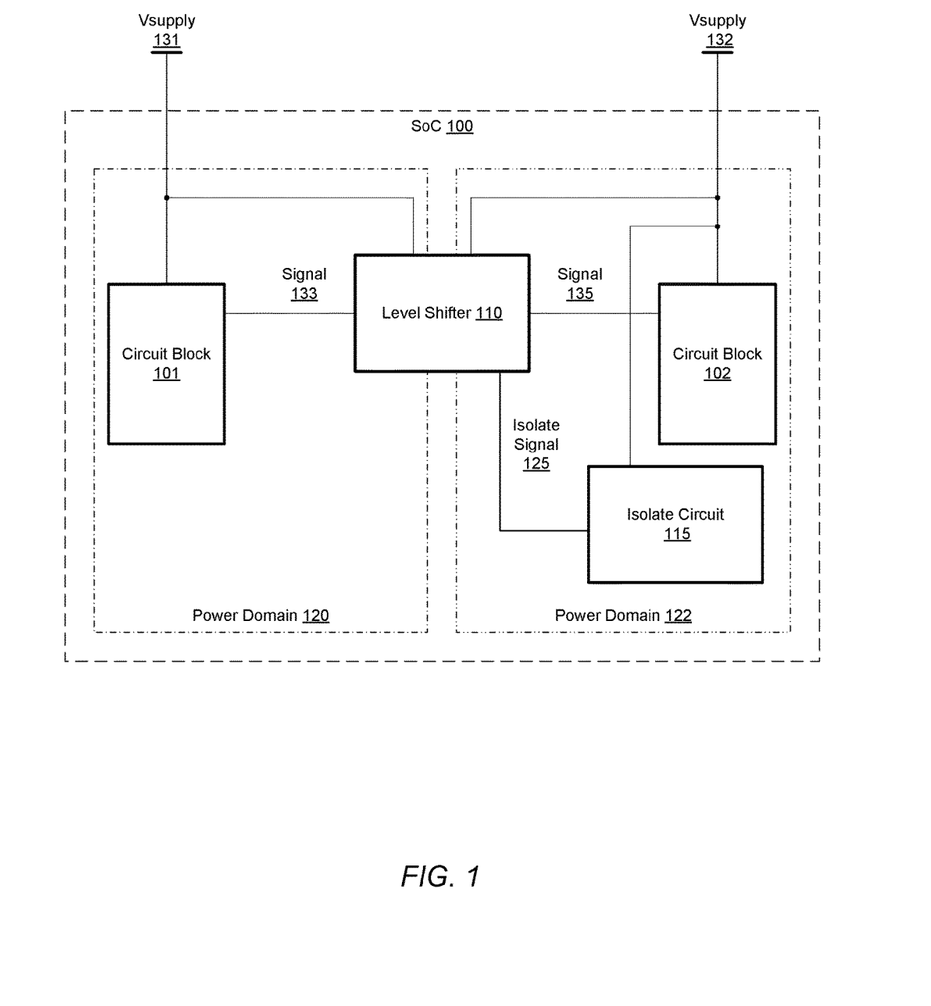
FIG. 1 depicts a block diagram of an embodiment of a system-on-a-chip (SoC) with two power domains.

A block diagram of an embodiment of an SoC with two power domains is depicted in FIG. 1. In the illustrated embodiment, SoC 100 includes circuit block 101, circuit block 102, level shifter 110, and isolate circuit 115. Circuit block 101 is coupled to supply voltage 131, and is included in power domain 120, while circuit block 102 is coupled to supply voltage 132, and is included in power domain 122. Isolate circuit 115 is also coupled to supply voltage 132 and included in power domain 122.

Level shifter 110 is coupled to both supply voltage 131 and supply voltage 132 and spans both power domain 120 and power domain 122. As described below in more detail, level shifter 110 may be configured to translate voltage levels of signal 133 to generate signal 135. Signals 133 and 135 transition between two voltage levels, each voltage level corresponding to a particular logic state. Signals that encode information in this fashion are commonly referred to as digital signals. For example, signal 133 may transition between a ground voltage level and a voltage level at or near the voltage level of supply voltage 131. In this case, the ground voltage level may correspond to a low logic level, and the voltage level at or near the voltage level of supply voltage 131 may correspond to a high logic level.

As used and described herein, a "low logic level," "low," or a "logic 0 value," corresponds to a voltage level sufficiently low to enable a p-channel MOSFET, and a "high logic level," "high," or a "logic 1 value," corresponds to a voltage level sufficiently high to enable an n-channel MOSFET. In various other embodiments, different technology, including technologies other than complementary metal-oxide semiconductor (CMOS), may result in different voltage levels for "low" and "high."

The voltage levels for high and low logic levels in power domain 120 and power domain 122 may be different. In order for signals from one power domain to be used by a circuit block in another power domain, the voltage levels for the high and low logic levels are translated to the voltage levels used in the target power domain. As mentioned above, level shifter 110 is configured to perform such voltage translation. It is noted that although translation of the voltage level corresponding to a high logic level is described below, in other embodiments, the voltage of the low logic level may also be translated instead of, or in addition to the translation of the voltage level of the high logic level.

Isolate circuit 115 is coupled to supply voltage 132, and is included in power domain 122. In various embodiments, isolate circuit 115 may be configured to generate isolate signal 125 in response to a change in an operational mode of SoC 100 or other suitable event, which causes level shifter 110 to isolate one or more circuit paths included in level shifter 110 as well as clamp one or more circuit nodes of level shifter 110 to predetermined values.

In some embodiments, a voltage level of supply voltage 131 may be greater than a voltage level of supply voltage 131. Alternatively, the voltage level of supply voltage 131 may be less than, or substantially the same as the voltage level of supply voltage 132. In various embodiments, supply voltage 131 and supply voltage 132 may be generated by a power management unit (not shown) included in SoC 100. During operation the voltage level of either of supply voltage 131 or supply voltage 132 may be at or near ground potential in response to a change in an operation mode of SoC 100 to an operation mode that consumes less power.

It is noted that the SoC illustrated in FIG. 1 is merely an example. In other embodiments, different circuit blocks and different configurations of circuit blocks may be possible depending upon the specific application for which the SoC is intended.

As described above, when transmitting signals across power domain boundaries, a level shifting circuit may be employed to translate the voltage levels of the high and low logic levels. An embodiment of such a level shifting circuit is depicted in the block diagram of FIG. 2. Level shifter 200 may, in various embodiments, correspond to level shifter 110 as illustrated in FIG. 1. It is noted that the that Level shifter 200 may be used to translate logic signals from a power domain associated with supply voltage 231 power domain to a power domain associated with supply voltage 232, or vice versa. In the illustrated embodiment, level shifter 200 includes input circuit 201, latch circuit 202, and isolation buffer circuit 203. Level shifter 200 receives isolation signal 240 and input signal 233, which is used to generate output signal 235 and complement output signal 236.

Figure 2:
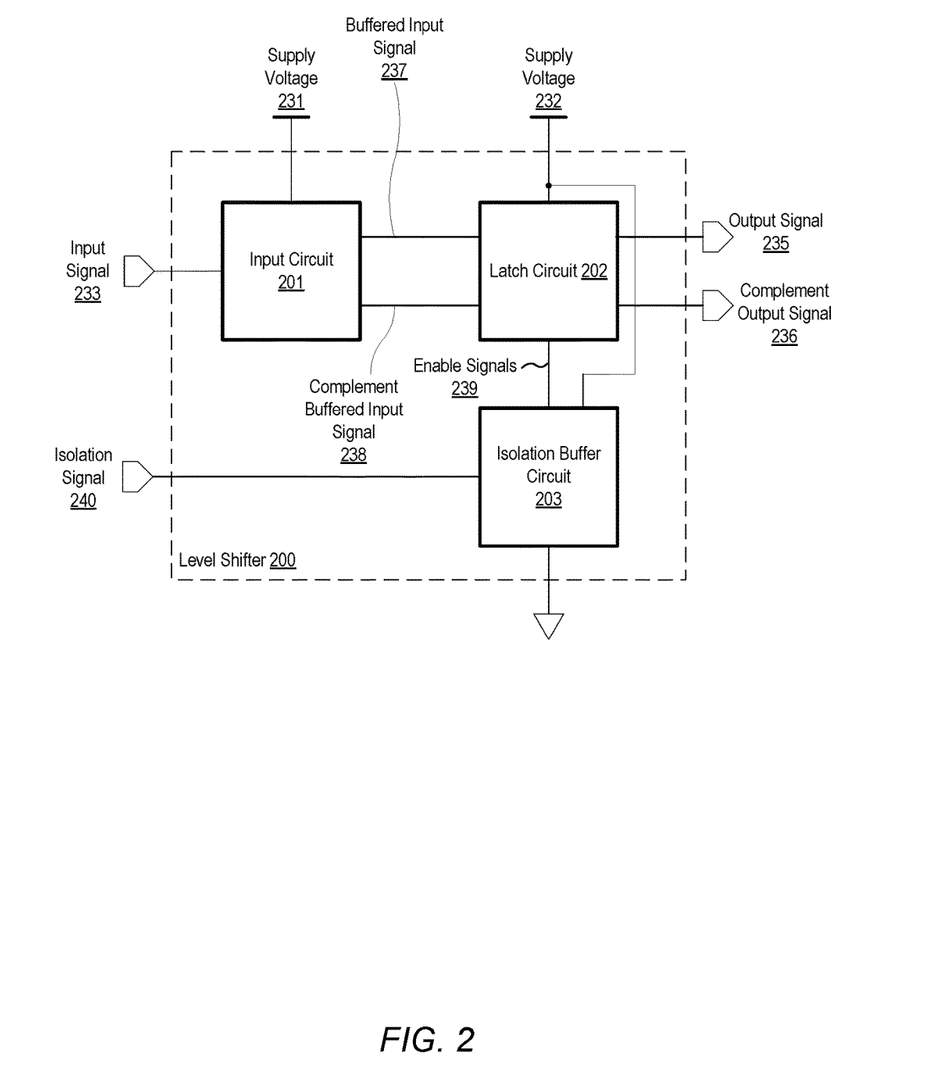
FIG. 2 illustrates a block diagram of an embodiment of a level shifting circuit.

Input circuit 201 receives input signal 233, which is generated by a circuit block coupled to supply voltage 231, and generates two output signals, the buffered input signal 237 and complement buffered input signal 238, using supply voltage 231. Buffered input signal 237 is a buffered version of input signal 233, while complement buffered input signal is the inverse of input signal 233.

Latch circuit 202 receives both buffered input signal 237 and complement buffered input signal 238 from input circuit 201. Latch circuit 202 is coupled to supply voltage 232, and generates output signal 235 and complement output signal 236 with logic levels corresponding to the logic levels of buffered input signal 237 and complement buffered input signal 238, respectively. The high logic level of both output signal and complement output signal 236 is at or near the voltage level of supply voltage 232.

Isolation buffer circuit 203 is coupled to both supply voltage 232 and supply voltage 231. Isolation buffer circuit 203 is configured to generate enable signals 239 using isolation signal 240. In various embodiments, isolation signal 240 may transition in response to a change in the voltage level of supply voltage 231. When the voltage level of supply voltage 231 drops below a threshold voltage level, a power management unit, or other suitable circuit, may assert isolation signal 240, signaling level shifter 200 to clamp storage circuit nodes (or simply "storage nodes") in latch circuit 202, as well as isolate one or more circuit paths in latch circuit 202. As used and described herein, a storage node is a circuit node that is used to maintain a particular voltage level corresponding to a particular logic level or value for a desired period of time. A storage node may be included in a feedback circuit, or any other suitable circuit, configured to maintain the aforementioned particular voltage level.

When the voltage level of supply voltage 231 returns to a level above the threshold voltage level, isolation signal 240 may be de-asserted, thereby returning latch circuit 202 to its initial operating state. By clamping the storage nodes, and isolating the circuit paths, level shifter 200 may, in various embodiments, avoid spurious logic changes on output signal 235 and complement output signal 236 when isolation signal 240 is de-asserted, as well as reduce leakage and crowbar current in latch circuit 202.

As described below in more detail, to clamp the storage nodes as described above, latch circuit 202 may enable a pull-up or pull-down device coupled to the aforementioned storage nodes. As used herein, a "pull-up" or "pull-down" device refers to a device, such as, for example, a resistor, transistor, or other suitable type of transconductance device coupled between a circuit node to be "pulled," and either a power node (pull-up) or ground node (pull-down).

It is noted that, to improve clarity and to aid in demonstrating the disclosed concepts, the block diagram illustrated in FIG. 2 has been simplified. In other embodiments, different and/or additional circuit blocks and different configurations of the circuit blocks are possible and contemplated.

Figure 3:
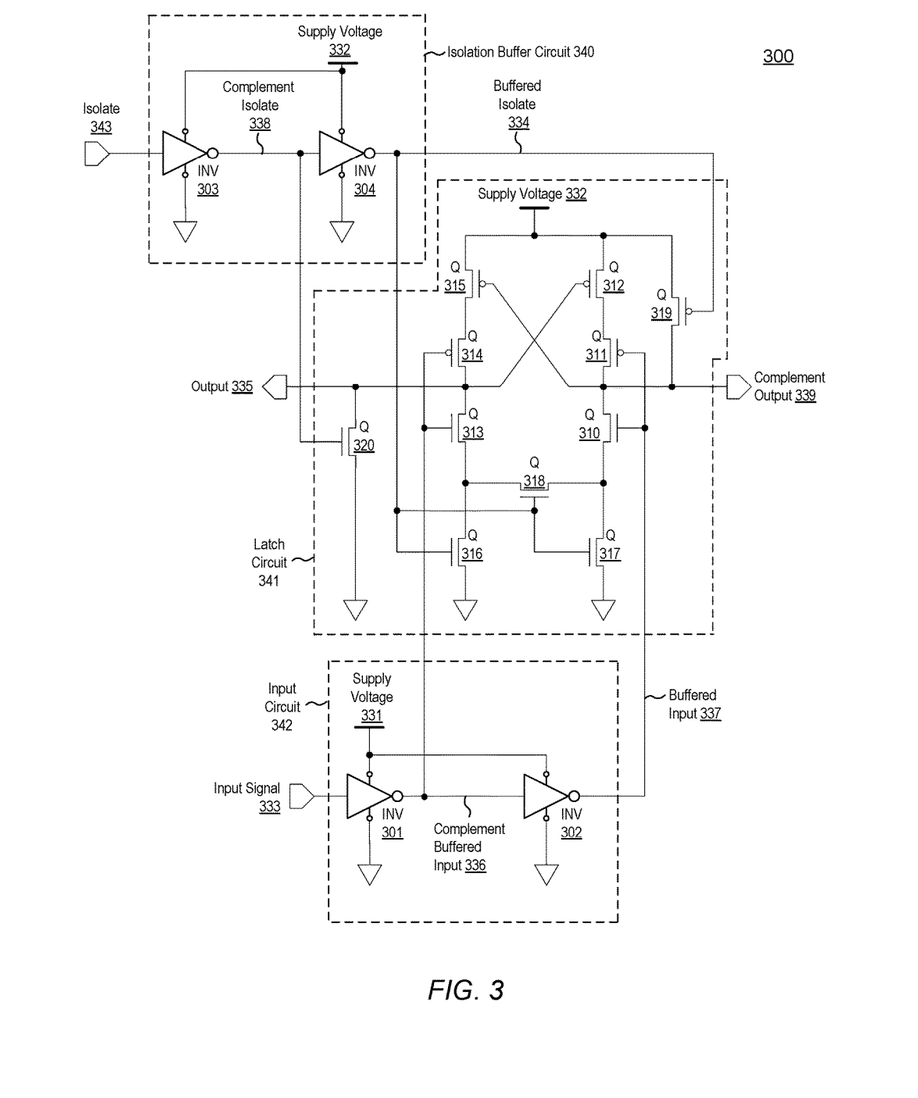
FIG. 3 shows a circuit diagram of a first embodiment of a level shifting circuit.

Turning to FIG. 3, a circuit diagram of a first embodiment of a level shifter circuit is shown. Level shifter 300 may, in various embodiments, correspond to level shifter 200 in FIG. 2. In the illustrated embodiment, level shifter 300 includes input circuit 342, latch circuit 341, and isolation buffer circuit 340.

Input circuit 342 includes inverters (INV) 301 and 302, and may, in some embodiments, correspond to input circuit 201 as illustrated in FIG. 2. INV 301 and INV 302 are coupled to supply voltage 331. During operation, INV 301 may invert the logical sense of input signal 333 to generate complement buffered input 336. INV 302 may invert the logical sense of complement buffered input 336 to generate buffered input 337, which may have the same logical sense as input signal 333. In some cases, the voltage level of supply voltage 331 may be allowed to drop to a level at or near ground potential during a power gating operation. When this occurs, INV 301 and INV 302 may not be able to operate, resulting in voltage levels of complement buffered input 336 and buffered input 337 that latch circuit 341 cannot discern as either a logic high or logic low value.

It is noted that an inverter, such as those shown and described herein, may be a particular embodiment of an CMOS inverting amplifier. In other embodiments, however, any suitable configuration of inverting amplifier that is capable of inverting the logical sense of a signal may be used, including inverting amplifiers built using technology other than CMOS.

Isolation buffer circuit 340 includes INV 303 and 304, and may, in various embodiments, correspond to isolation buffer circuit 203 as illustrated in FIG. 2. Power supply terminals of INV 303 and 304 are coupled to supply voltage 332. INV 303 inverts the logical sense of isolate 343 to generate complement isolate 338, and INV 304 inverts the logical sense of complement isolate 338 to generate buffered isolate 334.

Latch circuit 341 includes devices Q310 through Q320, and may correspond to latch circuit 202. Devices Q315 and Q312 are coupled to supply voltage 332, and are controlled by complement output 339 and output 335, respectively. Device Q315 is further coupled to device Q314, which is, in turn coupled to Output 335. Device Q312 is coupled to device Q311, which is, in turn, coupled to complement output 339. Device Q313 is coupled to output 335, and device Q310 is coupled to complement output 339. Both devices Q313 and Q310 are coupled to device 318. Devices Q314 and Q313 are controlled by complement buffered input 336, and devices Q311 and Q310 are controlled by buffered input 337. Device Q318 is further coupled to devices Q316 and Q317, both of which are further coupled to ground. Each of devices Q318, Q316, and Q317 are controlled by complement isolate 338.

Each of the devices described above, such as, e.g. Q310, may, in various embodiments, correspond to metal-oxide semiconductor field-effect transistors (MOSFETs) or any other suitable type of transconductance device. Although single devices are depicted in the diagram of FIG. 3, in other embodiments, multiple devices may be used in parallel to form any of the above devices.

Device Q320 is coupled between output 335 and ground, and is controlled by buffered isolate 334. Device Q319 is coupled between supply voltage 332 and complement output 339, and is controlled by complement isolate 338. As described above, device Q320 may be referred to as a pull-down device, and device Q319 may be referred to as a pull-up device. In the illustrated embodiment, output 335 and complement output 339 form the storage nodes of latch circuit 341, which maintain state via the regenerative feedback formed by the cross-coupled control signals of devices Q315 and Q312.

Level shifter 300 operates generally as described for Level shifter 200 in FIG. 2. When isolate 343 is at a high logic level, complement isolate 338 is at low logic level and buffered isolate 334 is at a high logic level. The low logic level of complement isolate 338 disables device Q320, and the high logic level on buffered isolate 334 disables device Q319, while enabling devices Q316, Q317, and Q318, allowing complement buffered input 336 and buffered input 337 to control devices Q314, Q313, Q311, and Q310, thereby determining the voltage levels of output 335 and complement output 339.

In response to the voltage level of supply voltage 331 dropping below a threshold voltage level, isolate 343 may transition to a low logic level, which results in a high logic level on complement isolate 338 and a low logic level on buffered isolate 334. The low logic level on buffered isolate 334 deactivates devices Q316, Q317, and Q318, isolating the circuit paths from devices Q313 and Q310 to ground. Furthermore, the low logic level on buffered isolate 334 enables device Q319, clamping complement output 339 to a voltage level at or near that of supply voltage 332. The high logic level on complement isolate 338 actives device Q320, clamping output 335 at or near ground potential.

Since devices Q316, Q317, and Q318 are deactivated, there is no active circuit path from devices Q313 and Q310 to ground. Indeterminate logic levels on complement buffered input 336 and buffered input 337, which may result from a low voltage level on supply voltage 331, may activate devices Q314 and Q313 in parallel (or alternatively, devices Q311 and Q310). Since, however, devices Q316 and Q317 are deactivated, there are no circuit paths from supply voltage 332 to ground, thereby preventing crowbar current. Moreover, since device Q318 is also deactivated, there is not path from complement output 339 to output 335 should the voltage levels of buffered input 337 and complement buffered input 336 be such to activate both devices Q310 and Q313.

By clamping output 335 and complement output 339 to ground and supply voltage 332, respectively, latch circuit 341 maintains a known logic state, such that when isolate 343 returns to a high logic level, other logic circuits coupled to output 335 and complement output 339 can function using the known logic state.

It is noted that level shifter 300 illustrated in FIG. 3 is merely an example. The circuit diagram includes sufficient elements for demonstrating the disclosed concepts. In other embodiments, additional circuit elements may be included. Furthermore, the placement of the circuit elements in FIG. 3 is not intended to imply an actual location of the elements in physical embodiments of the circuit.

Figure 4:
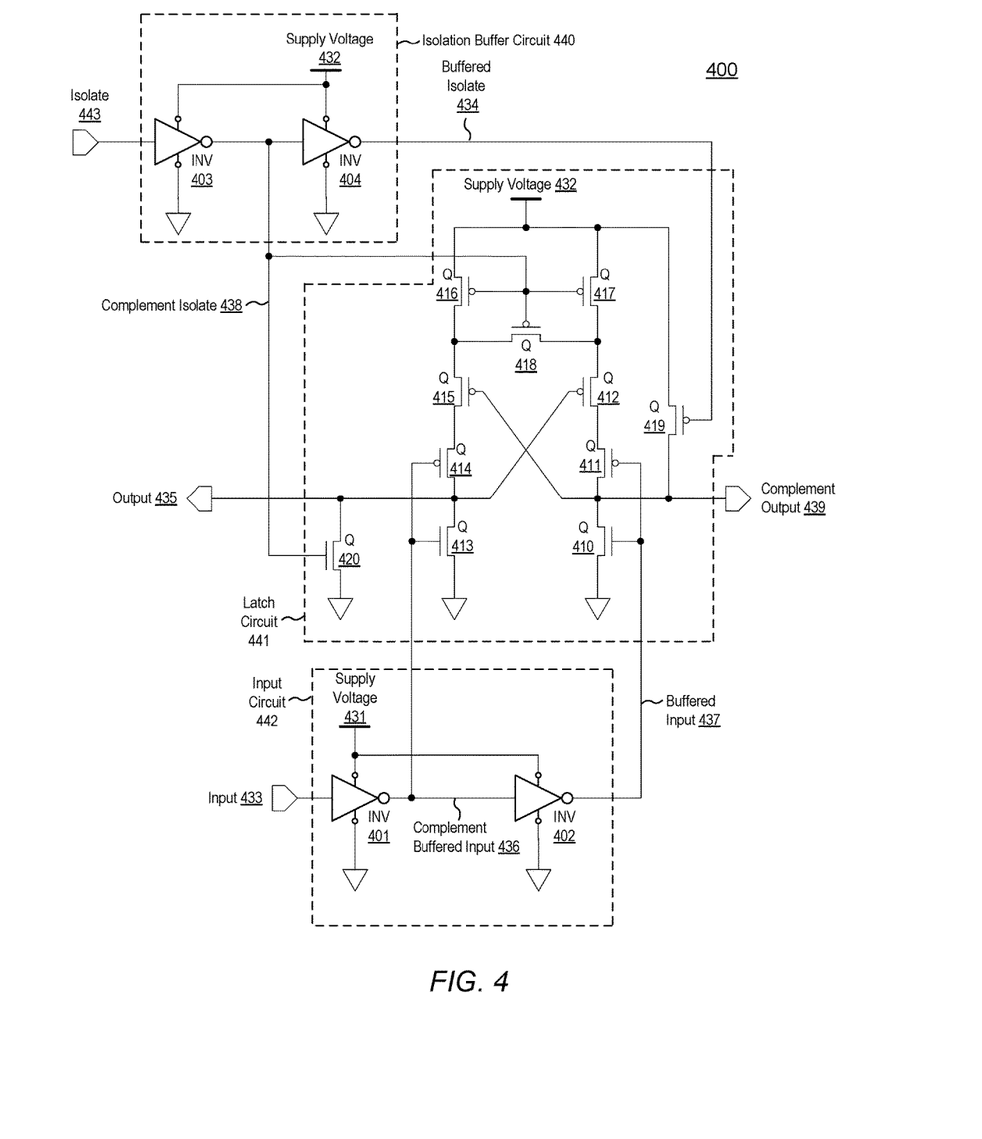
FIG. 4 depicts a circuit diagram of a second embodiment of a level shifting circuit.

Turning now to FIG. 4, a circuit diagram of a second embodiment of a level shifter circuit is depicted. Level shifter 400 is similar to level shifter 300 as depicted in FIG. 3, and may also correspond to level shifter 200 in FIG. 2. In the illustrated embodiment, level shifter 400 includes isolation buffer circuit 440, latch circuit 441, and input circuit 442. In various embodiments, isolation buffer circuit 440 is similar in design and function to isolation buffer circuit 340, and input circuit 442 is similar in design and function to input circuit 342.

Latch circuit includes devices Q410 through Q420. Devices Q416 and Q417 are coupled to supply voltage 432, and are controlled by complement isolate 438. Device Q418 is coupled to devices Q416 and Q417, is also controlled by buffered isolate 434. Device Q415 is coupled to device Q416 and is controlled by complement output 439, and device Q412 is coupled to device Q417 and is controlled by output 435. Device Q415 is further coupled to device Q414, which is, in turn, coupled to output 435 and device Q413. Both devices Q414 and Q413 are controlled by complement buffered input 436. Device Q412 is coupled to device Q411, which is, in turn, coupled to complement output 439 and device Q410. Devices Q411 and Q410 are controlled by buffered input 437. Device Q419 is coupled between supply voltage 432 and complement output 439, and is controlled by buffered isolate 434, while device Q420 is coupled between output 435 and ground, and is controlled by complement isolate 438.

As described above, device Q420 may be referred to as a pull-down device, and device Q419 may be referred to as a pull-up device. In the illustrated embodiment, output 435 and complement output 439 form the storage nodes of latch circuit 441, which maintain state via the regenerative feedback formed by the cross-coupled control signals of devices Q415 and Q412. It is noted that, in other embodiments, additional devices, such as, e.g., inverters may be coupled to the storage nodes in order to drive larger loads.

Level shifter 400 operates generally as described for level shifter 300 in FIG. 3. When isolate 443 is at a high logic level, INV 403 inverts the logical sense of isolate 443 resulting in a low logic level on complement isolate 438, and a high logic level on buffered isolate 434. The low logic level of complement isolate 438 disables device Q420 while enabling devices Q416, Q417, and Q418, and the high logic level on buffered isolate 434 disables device Q419.

When isolate 443 transitions to a low logic level, INV 403 generates a high logic level on complement isolate 438, resulting in a low logic level being generated on buffered isolate 434 by INV 404. The high logic level on complement isolate 438 deactivates devices Q416, Q417, and Q418, and enables device Q420, clamping output 435 to a voltage level at or near ground potential. The low logic level on buffered isolate 434 actives device Q420, clamping complement output 439 at or near the voltage level of supply voltage 432.

Since devices Q416, Q417, and Q418 are deactivated, there is no active circuit path from devices Q415 and Q412 to supply voltage 432. Indeterminate logic levels on complement buffered input 436 and buffered input 437, which may result from a low voltage level on supply voltage 431, may activate devices Q414 and Q413 in parallel (or alternatively, devices Q411 and Q410). Since, however, devices Q416, Q417, and Q418 are deactivated, there are not circuit paths from supply voltage 432 to ground, thereby preventing crowbar current. Moreover, since device Q418 is also deactivated, there is not path from complement output 439 to output 435 should the voltage levels of buffered input 437 and complement buffered input 436 be such to activate both devices Q414 and Q411.

By clamping output 435 and complement output 439 to ground and supply voltage 432, respectively, latch circuit 441 maintains a know logic state, such that when isolate 443 returns to a high logic level, other logic circuits coupled to output 435 and complement output 439 can function using the known logic state.

It is noted that the circuit illustrated in FIG. 4 and described herein is merely an example. Those skilled in the art will recognize that variations on this circuit are possible, such as, for example, Q419 and Q420 may be switched such that output 435 is clamped high and complement output 439 is clamped low when isolate 443 is at a low logic level. In other embodiments, additional circuit elements may be included.

Figure 5:
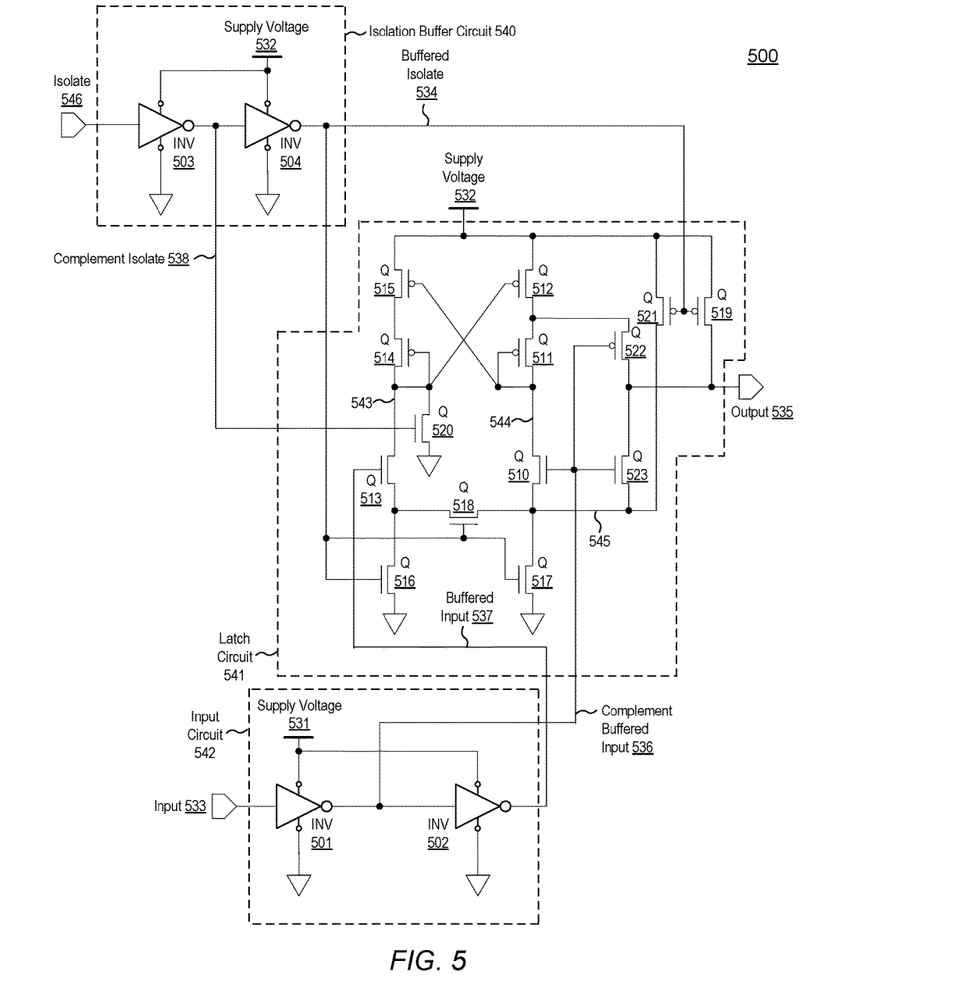
FIG. 5 illustrates a circuit diagram of a first embodiment of a level shifting circuit that includes an output driver circuit.

Moving now to FIG. 5, a circuit diagram of an embodiment of a level shifter circuit that includes an output driver circuit is illustrated. Level shifter 500 may, in various embodiments, correspond to level shifter 200 in FIG. 2. In the illustrated embodiment, level shifter 500 includes input circuit 542, latch circuit 541, and isolation buffer circuit 540. In various embodiments, isolation buffer circuit 540 is similar in design and function to isolation buffer circuit 340, and input circuit 542 is similar in design and function to input circuit 342.

Latch circuit 541 includes devices Q510 through Q523, and may correspond to latch circuit 202. Devices Q515 and Q512 are coupled to supply voltage 532, and are controlled by nodes 544 and 543, respectively. Device Q515 is further coupled to device Q514, which is, in turn coupled to node 543. Device Q512 is coupled to device Q511, which is, in turn, coupled to node 544. Device Q514 is controlled by node 543, and device Q511 is controlled by node 544. Device Q513 is also coupled to node 543 and is controlled by buffered input 537, and device Q510 is also coupled to node 544 and controlled by complement buffered input 536. Both device Q513 and Q510 are coupled to device Q518, which is further coupled to devices Q516 and Q517, both of which are further coupled to ground. Each of devices Q518, Q516, and Q517 are controlled by buffered isolate 534.

Device Q522 is coupled to device Q512 and device Q511, output 535, and is controlled by complement buffered input 536. Device Q532 is coupled to device Q522, as well as devices Q510, Q518, and Q517, and is controlled by complement buffered input 536. Devices Q521 and Q519 are coupled to supply voltage 532, and controlled by buffered isolate 534. Device Q512 is further coupled to devices Q523, Q510, Q518, and Q517. Device Q519 is further coupled to output 535. Device Q520 is coupled to node 543 and is controlled by complement isolate 538.

During operation when isolate 546 is at a high logic level, INV 503 inverts the logical sense of isolate 546, generating a low logic level on complement isolate 538, which is, in turn, inverted by INV 504 generating a high logic level on buffered isolate 534. The low logic level of complement isolate 538 disables device Q520, and the high logic level of buffered isolate 534 enables devices Q516, Q517, Q518, and disables devices Q521 and Q519. With devices Q516 and Q517 enabled, node 515 is discharged, creating a virtual ground.

Input circuit 542 generates buffered input 537 and complement buffered input 536 based on a value of input 533, in a fashion similar to that described above for input circuit 342. If input 533 is at a low logic level, then complement buffered input 536 is at a high logic level, which activates Q510 and Q523, discharging output 535 to the virtual ground of node 545.

Since device Q510 is enabled, node 544 may also be discharged to the virtual ground of node 545, thereby activating devices Q515 and Q511. The low logic level on buffered input 537 disables Q513, and the low logic level on complement isolate 538 disables Q520. Node 543 is charged through devices Q515 and Q514 to a voltage level less than supply voltage 532 due to the diode configuration of device Q514. The voltage level on node 543 disables device Q512.

When isolate 546 transitions to a low logic level, complement isolate 538 transitions to a high logic level, and buffered isolate 534 transitions to a low logic level. The high logic level on complement isolate 538 activates device Q520 clamping node 543 to ground, and the low logic level on buffered isolate 534 deactivates devices Q516, Q517, and Q518. The low logic level on buffered isolate 534 also activates devices Q521 and Q519, clamping node 545 and output 535 to a voltage level at or near the voltage level of supply voltage 532.

Since devices Q516, Q517, and Q518 are deactivated, there is no active circuit path from devices Q513 and Q510 to ground. Indeterminate logic levels on complement buffered input 536 and buffered input 537, which may result from a low voltage level on supply voltage 531, may activate devices Q513 and Q510 in parallel. Since, however, devices Q516, Q517, and Q518 are deactivated, there are not circuit paths from supply voltage 532 to ground, thereby preventing crowbar current. Moreover, since device Q518 is also deactivated, there is not path from node 545 to node 543 should the voltage levels of buffered input 537 and complement buffered input 536 be such to activate both device Q513.

By clamping output 535 to supply voltage 532, latch circuit 541 maintains a known logic state, such that when isolate 546 returns to a high logic level, other logic circuits coupled to output 535 can function using the known logic state.

It is noted that Level shifter 500 of FIG. 5 is an example circuit. In some embodiments, different circuit elements and different arrangement of circuit elements are possible and contemplated.

Figure 6:
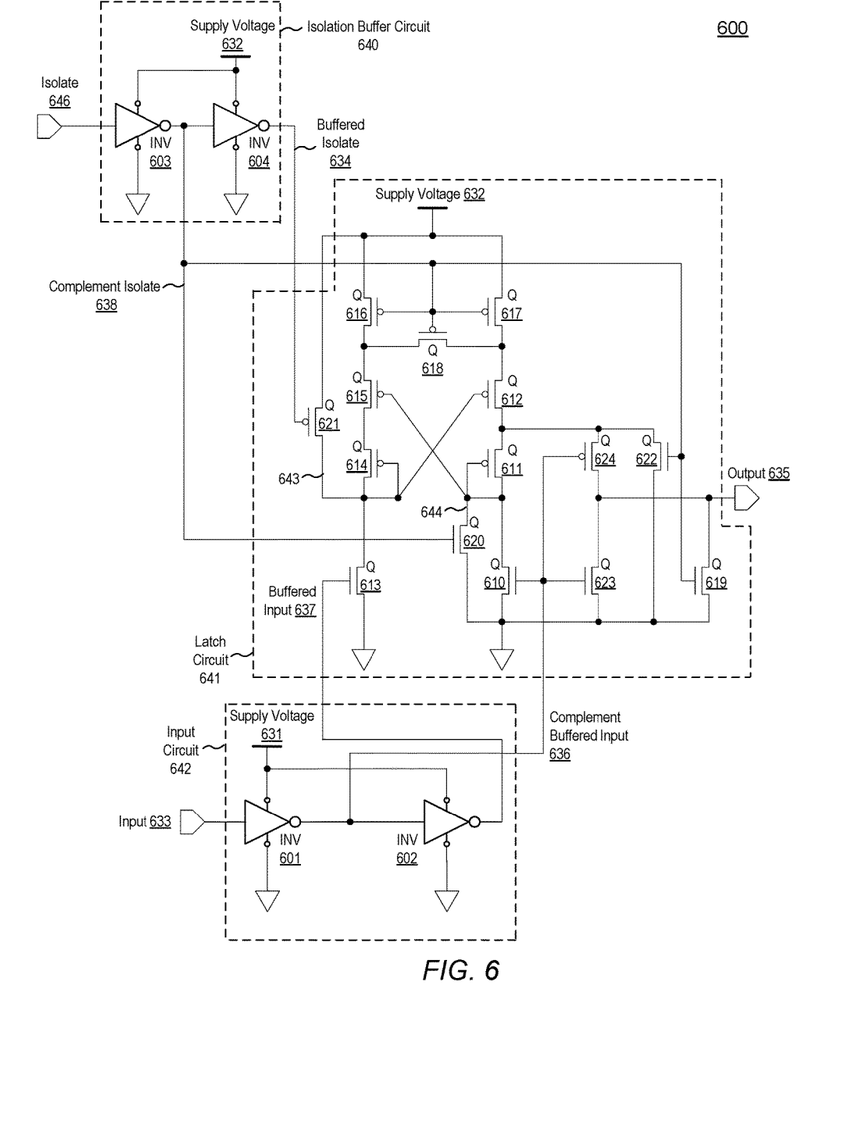
FIG. 6 shows a circuit diagram of a second embodiment of a level shifting circuit that includes an output driver circuit.

Moving now to FIG. 6, a circuit diagram of an embodiment of a level shifter circuit that includes an output driver circuit is illustrated. Level shifter 600 may, in various embodiments, correspond to level shifter 200 in FIG. 2. In the illustrated embodiment, Level shifter 600 includes input circuit 642, latch circuit 641, and isolation buffer circuit 640. In various embodiments, isolation buffer circuit 640 is similar in design and function to isolation buffer circuit 340, and input circuit 642 is similar in design and function to input circuit 342.

Latch circuit 641 includes devices Q610 through Q624, and may correspond to latch circuit 202. Devices Q616 and Q617 are coupled to supply voltage 632, and are controlled by complement isolate 638. Device Q618 is coupled to both Q616 and Q617 and is also controlled by complement isolate 638. Device Q616 is further coupled to device Q615, which is controlled by node 644, and device Q617 is further coupled to device Q612, which is controlled by node 643.

Device Q615 is further coupled to devices Q614 and Q621. Device Q614 is controlled by node 614, and device Q621 is controlled by buffered isolate 634. Device Q612 is further coupled to devices Q611, Q624, and Q622, which is also coupled to ground. Device Q611 is controlled by node 644, device Q624 is controlled by complement buffered input 636, and device Q622 is controlled by complement isolate 638. Device Q624 is also coupled to device Q623, which is coupled to ground and controlled by complement buffered input 636.

Device Q615 is further coupled to devices Q620 and Q610, which is also coupled to ground. Device Q620 is controlled by complement isolate 638, and device Q610 is controlled by complement buffered input 636. Device Q614 is further coupled to Q613, which is also coupled to ground, and is controlled by buffered input 637.

During operation when isolate 646 is at a high logic level, INV 603 inverts the logical sense of isolate 646, generating a low logic level on complement isolate 638, which is, in turn, inverted by INV 504 generating a high logic level on buffered isolate 634. The low logic level of complement isolate 638 disables device Q620, and enables devices Q616, Q617, and Q618, while the high logic level of buffered isolate 534 disables device Q621. With devices Q616 and Q617 enabled, the source terminals of device Q615 and Q612 are charged to a voltage at or near the voltage level of supply voltage 632.

Input circuit 642 generates buffered input 637 and complement buffered input 636 based on a value of input 633, in a fashion similar to that described above for input circuit 342. If input 633 is at a low logic level, then complement buffered input 636 is at a high logic level, which activates Q610 and Q623, discharging output 635 and node 644 to ground.

Since device Q610 is enabled, node 644 is discharged to ground, thereby activating devices Q615 and Q611. The low logic level on buffered input 637 disables Q613, and the low logic level on complement isolate 638 disables Q620. Node 543 is charged through devices Q615 and Q614 to a voltage level less than supply voltage 632 due to the diode configuration of device Q614. The voltage level on node 543 disables device Q516.

When isolate 646 transitions to a low logic level, complement isolate 638 transitions to a high logic level, and buffered isolate 634 transitions to a low logic level. The high logic level on complement isolate 638 activates device Q620 clamping node 643 to ground, and the low logic level on buffered isolate 634 deactivates devices Q616, Q617, and Q618. The low logic level on buffered isolate 634 also activates device Q621, clamping node 643 to a voltage level at or near the voltage level of supply voltage 532. The high logic level on complement isolate 638 also activates devices Q622 and Q619 clamping the source terminal of device Q624 and output 635 to ground.

Since devices Q616, Q617, and Q618 are deactivated, there is no active circuit path from devices Q613 and Q610 to supply voltage 632. Indeterminate logic levels on complement buffered input 636 and buffered input 637, which may result from a low voltage level on supply voltage 631, may activate devices Q613 and Q610 in parallel. Since, however, devices Q616, Q617, and Q618 are deactivated, there are not circuit paths from supply voltage 632 to ground, thereby preventing crowbar current. Moreover, since device Q618 is also deactivated, there is not path from node 644 to node 643 via devices Q614, Q615, Q612, and Q611.

By clamping output 635 to ground, latch circuit 641 maintains a known logic state, such that when isolate 646 returns to a high logic level, other logic circuits coupled to output 635 can function using the known logic state.

It is noted that the circuit of FIG. 6 is merely an example. Variations on the circuit depicted in FIG. 6, and the other circuits presented herein, are possible and contemplated.

Figure 7:
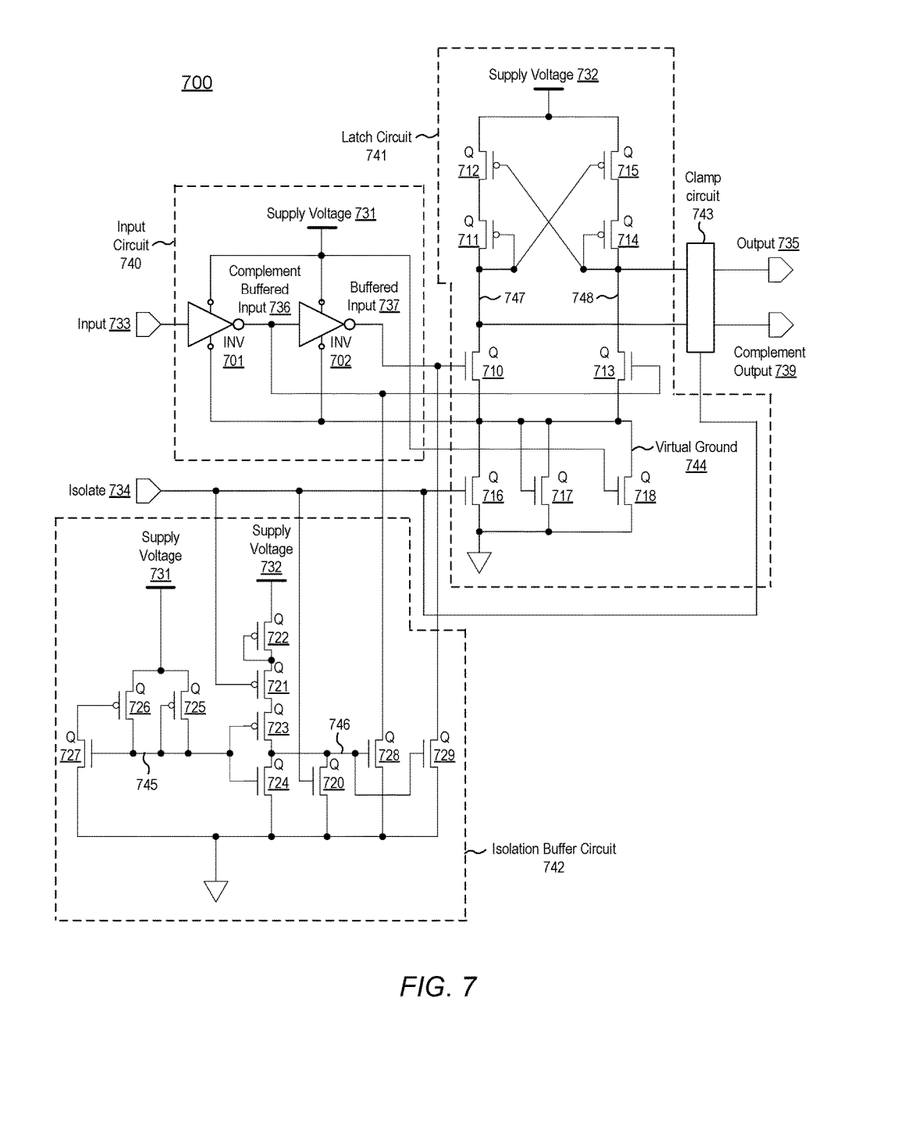
FIG. 7 depicts a circuit diagram of another embodiment of a level shifting circuit.

Proceeding to FIG. 7, a circuit diagram of another embodiment of a level shifter is depicted. In various embodiments, level shifter 700 may correspond to Level shifter 200 in FIG. 2. In the illustrated embodiment, level shifter 700 input circuit 740, latch circuit 741, clamp circuit 743, and isolation buffer circuit 742. In various embodiments, input circuit 740 is similar in design and function to input circuit 342.

Latch circuit 741 includes devices Q710 through Q718, and may correspond to latch circuit 202. Devices Q712 and Q715 are coupled to supply voltage 732, and are controlled by nodes 748 and 747, respectively. Device Q712 is further coupled to device Q711, which is controlled by node 747, and device Q715 is further coupled to device Q714, which is controlled by node 748. Device Q711 is further coupled to device Q710, which is coupled to virtual ground 744 and is controlled by buffered input 737. Device Q714 is further coupled to device Q713, which is coupled to virtual ground 744 and is controlled by complement buffered input 736.

Devices Q716, Q717, and Q718 are each coupled between virtual ground 744 and ground. Device Q716 is controlled by isolate 734, while device Q718 is controlled by supply voltage 731. Device Q717 is controlled by virtual ground 744. When isolate 734 is at a high logic level, device Q716 is enabled, discharging virtual ground 744 to ground. Additionally, when supply voltage 731 is at least an n-channel threshold above ground, device Q718 is also enabled, providing another discharge path between virtual ground 744 and ground.

When isolate 734 transitions to a low logic level, device Q716 is disabled. At a similar time, the voltage level of supply voltage 731 may also drop to a level that device Q718 is also disabled. During this time, device Q717 may be enabled by an increase in the voltage level of virtual ground 744 due to leakage from other devices in latch circuit 741. By employing device Q717, virtual ground 744 may be kept at a voltage near ground when isolate 734 is at a low logic level, thereby providing a faster return time to an operational state upon isolate 734 returning to a high logic level.

Isolation buffer circuit 742 includes devices Q720 through Q729. Devices Q726 and Q725 are coupled between supply voltage 731 and node 745. The control terminal of device Q726 is coupled to the device Q727, and the control terminal of device Q725 is coupled to node 745 is a diode-connected fashion. Collectively devices Q726, Q726, and Q727 form a "tie-high circuit," which holds node 745 to the voltage level of supply voltage 731. During operation when supply voltage 731 is at or near its specified operating voltage level, node 745 is pulled up to a voltage level that is a diode drop from the voltage level of supply voltage 731 via device Q725. The voltage level on node 745 activates device Q727, which discharges the control terminal of device Q726, causing device Q726 to activate. Node 745 is then pulled up to the voltage level of supply voltage 731 via device Q726.

Node 745 is further coupled to the control terminals of devices Q723 and Q724, which are coupled together in a common drain fashion to node 746. Device Q724 is further coupled to ground, while device Q723 is further coupled to device Q721, whose control terminal is coupled to isolate 734. Device Q721 is further coupled to device Q722, which is coupled between supply voltage 732 and device Q721 in a diode-connected fashion. Device Q720 is coupled between ground and node 746, and is controlled by isolate 734. Device Q728 is coupled between ground and complement buffered input 736, and device Q729 is coupled between ground and buffered input 737. The control terminals of devices Q728 and Q729 are coupled to node 746.

During operation, when isolate 734 is at a high logic level, device Q721 is inactive, disabling the circuit path through devices Q721-Q724. The high logic level on isolate 724 activates device Q720, which discharges node 726 to ground potential. The ground potential on node 746 disables devices Q728 and Q729.

When isolate 734 transitions to a low logic level, device Q721 is activated and device Q720 is disabled. During this time, as the voltage level of supply voltage 731 drops, the voltage level of node 745 also drops, eventually enabling device Q723. Node 746 may then be charged to the voltage level of supply voltage 732, less the diode drop across device Q722. The increase in voltage level on node 746 then activates devices Q728 and Q729, discharging complement buffered input 736 and buffered Input 737, respectively, to ground potential. As noted above, when the voltage level on supply voltage 731 is not at its specified operating level, the voltage levels of complement buffered input 736 and buffered input 737 may be indeterminate. By activating devices Q728 and Q729 in the fashion described above, complement buffered input 736 and buffered input 737 are set to a known logic value, in this case, a logic 0 value, which deactivates devices Q710 and Q713 in latch circuit 741, thereby preventing crowbar current through latch circuit 741.

Clamp circuit 743 is coupled between latch circuit 741, and output 735 and complement output 739. As described above in regard to latch circuit 741, when isolate 734 is low, circuit paths from devices Q711 and Q714 to virtual ground 744 are opened to prevent crowbar current from flowing supply voltage 732 into virtual ground 744. By opening (or decoupling) the aforementioned circuit paths, the voltage levels of storage nodes 747 and 748 may become indeterminate. Clamp circuit 743 may, in various embodiments, include any suitable combination of devices, logic gates, and the like, configured to set storage nodes 747 and 748, and additionally, output 735 and complement output 739 to particular logic values. For example, node 748 and output 735 may be set to a high logic level, while node 747 and complement output 739 may be set to a low logic level, or any other suitable combination of logic values.

It is noted that level shifter 700 is an example circuit that demonstrates concepts disclosed herein. In other embodiments, additional circuit elements and/or different circuit topologies are possible and contemplated.

Figure 8:
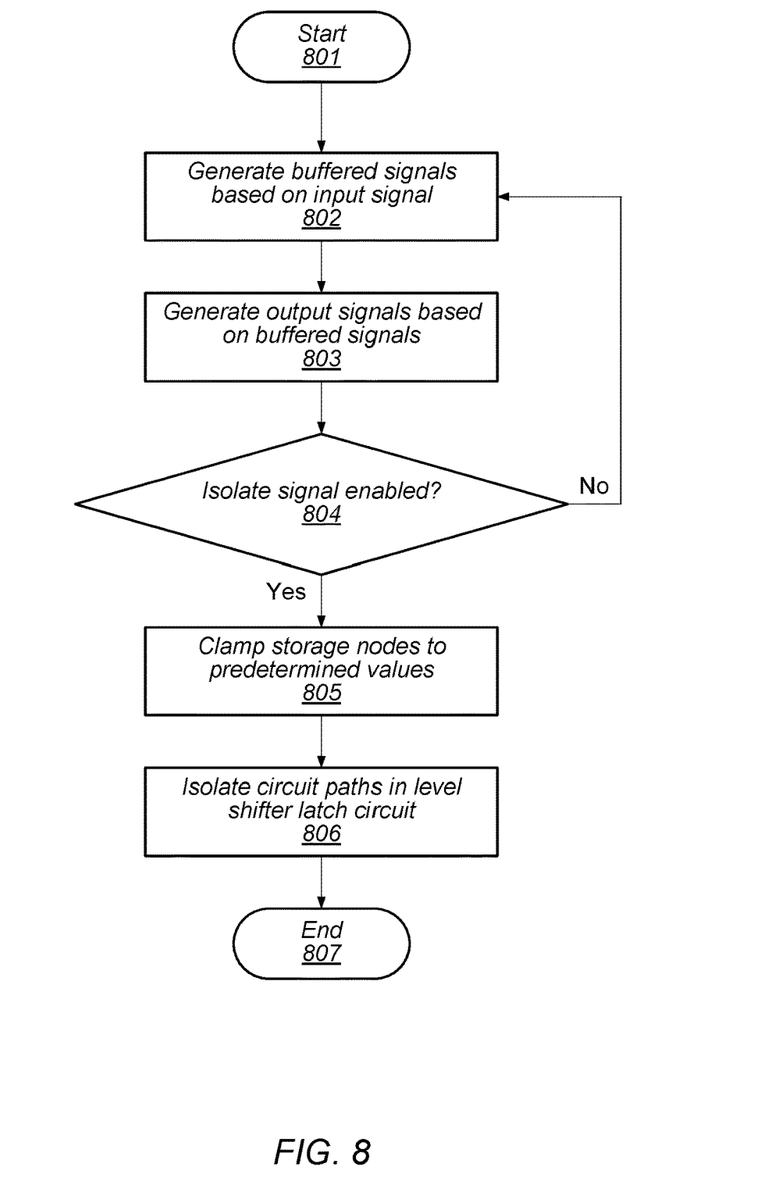
FIG. 8 illustrates a flow diagram of an embodiment of a method for operating a level shifting circuit.

Moving to FIG. 8, a flow diagram depicting an embodiment of a method for operating a level shifting circuit is illustrated. The embodiment of the method illustrated in the present embodiment may be applied to Level shifter 200 of FIG. 2, including to any of Level shifters 300-700, as disclosed herein. Referring collectively to the circuit of FIG. 3 and the flow diagram of FIG. 8, the method begins in block 801.

Buffered signals are generated based on an input signal (block 802). Input signal 333, which is generated in the power domain, associated with supply voltage 331 is received by INV 301, which generates complement buffered input 336 with a logic value that is the complement of input signal 333. INV 302 receives complement buffered input 336 and generates buffered input 337 with a same logical sense as input signal 333. In the illustrated embodiment, both complement buffered input 336 and buffered input 337 are generated in the power domain associated with supply voltage 331.

Output signals are generated based on the buffered input signals (block 803). As described above in regards to FIG. 3, latch circuit 341 generates output 335 and complement output 339 based on the values of complement buffered input 336 and buffered input 337. In the illustrated embodiment, output 335 is generated with a same logical sense as buffered input 337, while complement output 339 is generated with the same logical sense as complement buffered input 336. It is noted, that in other embodiments, the logical sense of the signals may be reversed. Both output 335 and complement output 339 are generated in the power domain associated with supply voltage 332, which may have a higher, lower, or even the same voltage level as supply voltage 331. The method may then depend on a state of isolate 343 (block 804).

As described above, the state of isolate 343 may be based on the voltage level of a power supply, such as, e.g., supply voltage 331. If isolate 343 is at a high logic level, then the method may proceed from block 802 as described above. Alternatively, if isolate 343 is at a low logic level, the storage nodes are clamped to predetermined values (block 805). In various embodiments, devices, such as, e.g., devices Q319 and Q320 may be activated to pull-up or pull-down a particular storage node included in the level shifter circuit. By clamping the storage nodes of level shifter 300, other circuits relying on the output signals of level shifter 300 have particular logic values with which to operate.

Circuit paths within level shifter 300 may then be isolated (block 806). In some embodiments, devices, such as, e.g., Q316 and Q317, may be deactivated, isolating other devices from a ground node. In other cases, circuit paths to a power supply node may also be isolated. By isolating such circuit paths, crowbar current from the power supply node to the ground node may be reduced. The method may then conclude in block 807.

It is noted that the method illustrated in FIG. 8 is merely an example. In other embodiments, additional operations may be included or some operations may be performed in a different order.

Figure 9:
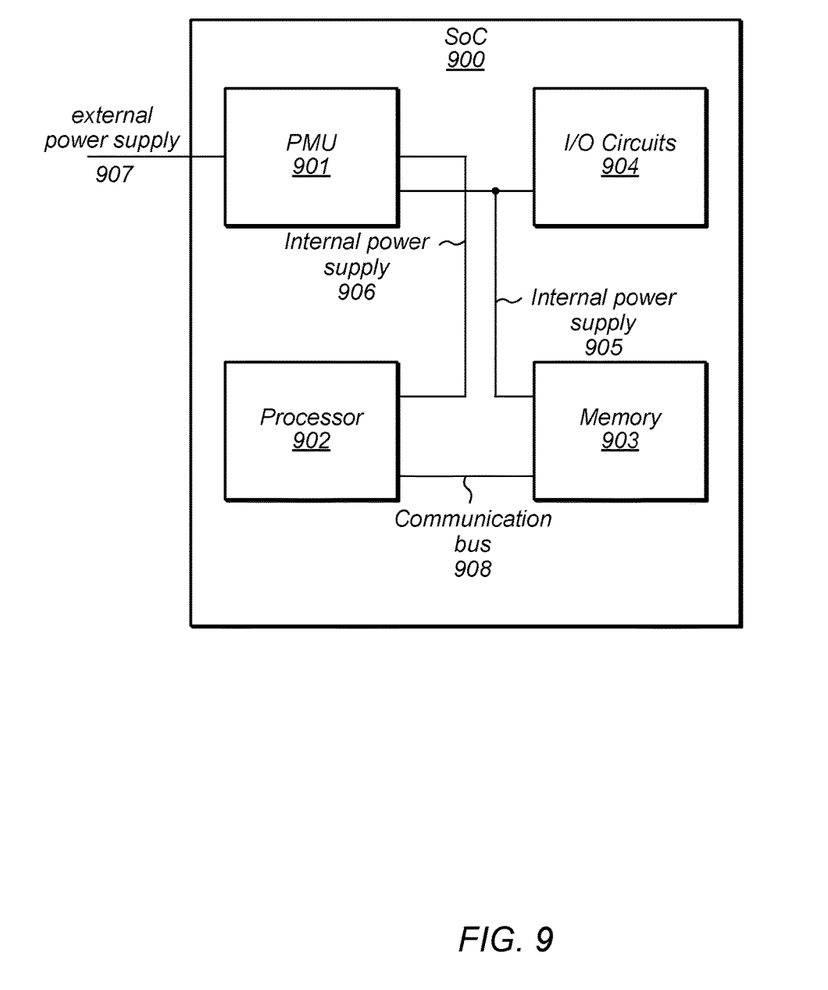
FIG. 9 depicts a block diagram of an embodiment of an SoC.

Turning to FIG. 9, an embodiment of an SoC is illustrated. In various embodiments, SoC 900 may correspond to SoC 100 as illustrated in the embodiment of FIG. 1. In the illustrated embodiment, SoC 900 includes power management unit (PMU) 901, processor 902, memory 903, and input/output (I/O) circuits 904. Processor 902 is coupled to internal power supply 906, while I.O circuits 904 and memory 903 are coupled to internal power supply 905.

PMU 901 may include voltage regulation and associated control circuits (not shown) configured to generate internal power supplies 905 and 906 using external power supply 907. Although two internal power supplies are depicted in the embodiment of FIG. 9, in other embodiments, any suitable number of internal power supplies may be employed. In some cases, each internal power supply may have a different voltage level.

Memory 903 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an SoC illustrated in FIG. 9, a single memory is depicted. In other embodiments, any suitable number of memory blocks may be employed.

Processor 902 may include one or more processor cores configured to execute program instructions according to a particular instruction set architecture (ISA). During execution of program instructions, Processor 902 may retrieve the program instructions from memory 903 using communication bus 908. In various embodiments, communication bus 908 may be configured to allow requests and responses to be exchanged between processor 902 and memory 903 according to a particular one of various communication protocols.

Since processor 902 and memory 903 are coupled to different internal power supplies, either processor 902 or memory 903 may employ a level shifter, such as, e.g., level shifter 200, to translate voltage levels of signals included on communication bus 908.

I/O circuits 904 may be configured to coordinate data transfer between SoC 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O circuits 904 may be configured to implement a version of Universal Serial Bus (USB) protocol or IEEE 1394 (Firewire®) protocol.

It is noted that the embodiment illustrated in FIG. 9 is merely an example. In other embodiments, different circuit blocks and different arrangements of circuit blocks are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
   a first circuit block coupled to a first power supply signal, wherein the first circuit block is configured to generate an input signal using the first power supply signal; and
   a level shifter circuit including a latch circuit, wherein the level shifter circuit is coupled to the first power supply signal and a second power supply signal, and wherein the level shifter circuit is configured to:
      generate an output signal using the input signal and the second power supply signal;
      in response to a determination that an isolation signal is enabled:
         set a storage node of the latch circuit to a first voltage level by activating a first device coupled between the storage node and ground;
         set a complement storage node of the latch circuit to a second voltage by activating a second device coupled between the complement storage node and the second power supply signal; and
         isolate at least one circuit path included in the level shifter circuit from the second power supply signal.

2. The system of claim 1, wherein to isolate the at least one circuit path, the level shifter circuit is further configured to deactivate at least one device coupled to the second power supply signal.

3. The system of claim 1, wherein to isolate the at least one circuit path, the level shifter circuit is further configured to deactivate at least one device coupled to a ground node.

4. The system of claim 1, wherein the level shifter circuit is further configured to generate a buffered signal and a complement buffered signal using the input signal, and wherein to generate the output signal, the level shifter circuit is further configured to generate the output signal using the buffered signal and the complement buffered signal.

5. The system of claim 1, wherein a voltage level of the first power supply signal is different than a voltage level of the second power supply signal.

6. The system of claim 1, further comprising a second circuit block configured to generate the isolation signal based on a voltage level of the first power supply signal.

7. A method comprising:
   receiving an input signal from a first circuit block coupled to a first power supply signal;
   generating, by a level shifter circuit coupled to a second power supply signal, an output signal using the input signal and the second power supply signal;
   in response to determining an isolation signal is enabled:
      setting a voltage level of a storage node included in the level shifter circuit to a first value by activating a first device coupled between the storage node and ground;
      setting a voltage level of a complement storage node included in the level shifter circuit to a second value by activating a second device coupled between the complement storage node and the second power supply signal; and
      isolating at least one circuit path included in the level shifter circuit from the second power supply signal.

8. The method of claim 7, wherein isolating the at least one circuit path included in the level shifter circuit includes deactivating at least one device coupled to the second power supply signal.

9. The method of claim 7, wherein isolating the at least one circuit path included in the level shifter circuit includes deactivating at least on device coupled to a ground node.

10. The method of claim 7, further comprising generating a buffered signal and a complement buffered signal using the input signal, and generating the output signal using the buffered signal and the complement buffered signal.

11. The method of claim 7, wherein a voltage level of the first power supply signal is different than a voltage level of the second power supply signal.

12. The method of claim 7, further comprising generating, by a second circuit block, the isolation signal based on a voltage level of the first power supply signal.

13. The method of claim 7, wherein setting the voltage level of the storage node include activating a device coupled to the storage node and the second power supply signal.

14. An apparatus, comprising:
   an input circuit coupled to a first power supply signal, wherein the input circuit is configured to:
      receive an input signal; and
      generate a buffered signal and a complement buffered signal using the input signal;
   a latch circuit coupled to a second power supply signal, wherein the latch circuit is configured to:
      generate an output signal using the input signal and the second power supply signal;
      in response to a determination that an isolation signal is enabled:
         set a storage node included in the latch circuit to a first voltage level by activating a first device coupled between the storage node and ground;
         set a complement storage node included in the latch circuit to a second voltage level by activating a second device coupled between the complement storage node and the second power supply signal; and
         isolate at least one circuit path included in the latch circuit from the second power supply signal.

15. The apparatus of claim 14, wherein to isolate the at least one circuit path, the latch circuit is further configured to deactivate at least one device included in the latch circuit coupled to the second power supply signal.

16. The apparatus of claim 14, wherein to isolate the at least one circuit path, the latch circuit is further configured to deactivate at least one device included in the latch circuit coupled to a ground node.

17. The apparatus of claim 14, wherein the latch circuit is further configured to discharge the output signal to ground potential based on the isolation signal.

18. The apparatus of claim 14, further comprising an isolation buffer circuit coupled to the second power supply signal, wherein the isolation buffer circuit is configured to generate a buffered isolation signal and a complement buffered isolation signal.

19. The apparatus of claim 18, wherein the latch circuit is further configured to isolate the at least one circuit path using at least one of the buffered isolation signal or the complement buffered isolation signal.

20. The apparatus of claim 14, wherein a voltage level of the first power supply signal is different than a voltage level of the second power supply signal.

* * * * *